(12) United States Patent
Ting et al.

(10) Patent No.: US 7,064,072 B1
(45) Date of Patent: Jun. 20, 2006

(54) METHOD FOR FABRICATING TRENCH ISOLATION

(75) Inventors: Wei-Chi Ting, Tainan Hsien (TW); Jen-Yuan Wu, Yun-Lin Hsien (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/907,924

(22) Filed: Apr. 21, 2005

(51) Int. Cl.
*H01L 21/302* (2006.01)

(52) U.S. Cl. .............. 438/700; 438/424; 438/425; 438/477; 207/192.23

(58) Field of Classification Search .......... 438/700, 438/424
See application file for complete search history.

(56) References Cited

U.S. PATENT DOCUMENTS 5,981,353 A * 11/1999 Tsai ..................... 438/424
6,573,152 B1 * 6/2003 Fazio et al. ............ 438/424

* cited by examiner

*Primary Examiner*—Nadine Norton
*Assistant Examiner*—Patricia George
(74) *Attorney, Agent, or Firm*—Winston Hsu

(57) ABSTRACT

A semiconductor substrate having a front surface and a backside is prepared. A first silicon oxide layer is formed on the front surface of the semiconductor substrate and, simultaneously, forming a second silicon oxide layer on the backside of the semiconductor substrate. A first silicon nitride layer is formed on the front surface of the semiconductor substrate and, simultaneously, forming a second silicon nitride layer on the backside of the semiconductor substrate. Lithographic and etching process is performed, using the first silicon nitride layer as an etching hard mask, to etch a trench into the front surface of the semiconductor substrate. The trench is then filled with insulating material. Using the insulating material as an etching hard mask, the second silicon nitride layer on the backside of the semiconductor substrate is etched away. A densification process is then performed to densify the insulating material.

5 Claims, 11 Drawing Sheets

METHOD FOR FABRICATING TRENCH ISOLATION

BACKGROUND OF INVENTION

1. Field of the Invention

The present invention relates to the field of semiconductor fabrication and, more particularly, to a method for fabricating trench isolation structures.

2. Description of the Prior Art

During the fabrication of semiconductor devices such as shallow trench isolation (STI) structures, high-temperature thermal processes are ordinarily carried out in order to form thermally grown dielectric films or to repair surface damages. As device dimension shrinks to very deep sub-micron scale or beyond, silicon surface defects such as dislocation or slipping becomes a critical issue that might adversely affect device performance.

FIG. 1 to FIG. 5 are schematic, cross-sectional diagrams demonstrating a typical trench isolation process. As shown in FIG. 1, a pad oxide layer 12 and a pad nitride layer 14 are sequentially formed on a front surface 100 of a semiconductor substrate 10. The pad oxide layer 12 is a thermally grown film, while the pad nitride layer 14 is formed by chemical vapor deposition methods. Simultaneously, a silicon oxide layer 22 and a silicon nitride layer 24 are formed on the backside 200 of the semiconductor substrate 10.

As shown in FIG. 2, using the pad nitride layer 14 as an etching hard mask, a lithographic process and an etching process are carried out to etch a trench 30 into the selected area of the front surface 100 of the semiconductor substrate 10.

As shown in FIG. 3, subsequently, an oxidation process is carried out to form a liner oxide layer 40 on interior surface of the trench 30.

As shown in FIG. 4, a high-density plasma chemical vapor deposition (HDP CVD) process is performed to deposit a high-density plasma silicon oxide film 50 over the substrate and into the trench 30. As known in the art, in order to provide better isolation, the high-density plasma silicon oxide film 50 is then subjected to a densification process under an inert environment. Another purpose of this densification process is to repair the damaged silicon surface due to the etching plasma.

As shown in FIG. 5, using the pad nitride layer 14 as a polish stop, a chemical mechanical polishing (CMP) process is then conducted to planarize the high-density plasma silicon oxide film 50.

The above-described prior art method has several drawbacks. First, during the densification process, the silicon nitride layer 24 on the backside 200 of the semiconductor substrate 10 peels off and becomes a potential source of particle contamination, which affects the subsequent lithographic processes. Secondly, it is often desired to apply higher temperatures during the densification process because higher temperatures can repair the damaged silicon surface in a more efficient manner. However, dislocation or slipping defects occur due to the use of higher temperatures.

SUMMARY OF INVENTION

It is therefore a primary object of the present invention to provide an improved method of fabricating trench isolation, thereby solving the above-mentioned prior art problems.

According to the claimed invention, a method for fabricating trench isolation is provided. A semiconductor substrate having a front surface and a backside is prepared. A first silicon oxide layer is formed on the front surface of the semiconductor substrate and, simultaneously, forming a second silicon oxide layer on the backside of the semiconductor substrate. A first silicon nitride layer is formed on the front surface of the semiconductor substrate and, simultaneously, forming a second silicon nitride layer on the backside of the semiconductor substrate. Lithographic and etching process is performed, using the first silicon nitride layer as an etching hard mask, to etch a trench into the front surface of the semiconductor substrate. The trench is then filled with insulating material. The insulating material also covers the first silicon nitride layer. Using the insulating material as an etching hard mask, the second silicon nitride layer on the backside of the semiconductor substrate is etched away. A densification process is then performed to densify the insulating material. Using the first silicon nitride layer as a polish stop, a chemical mechanical polishing process is performed to planarize the insulating material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
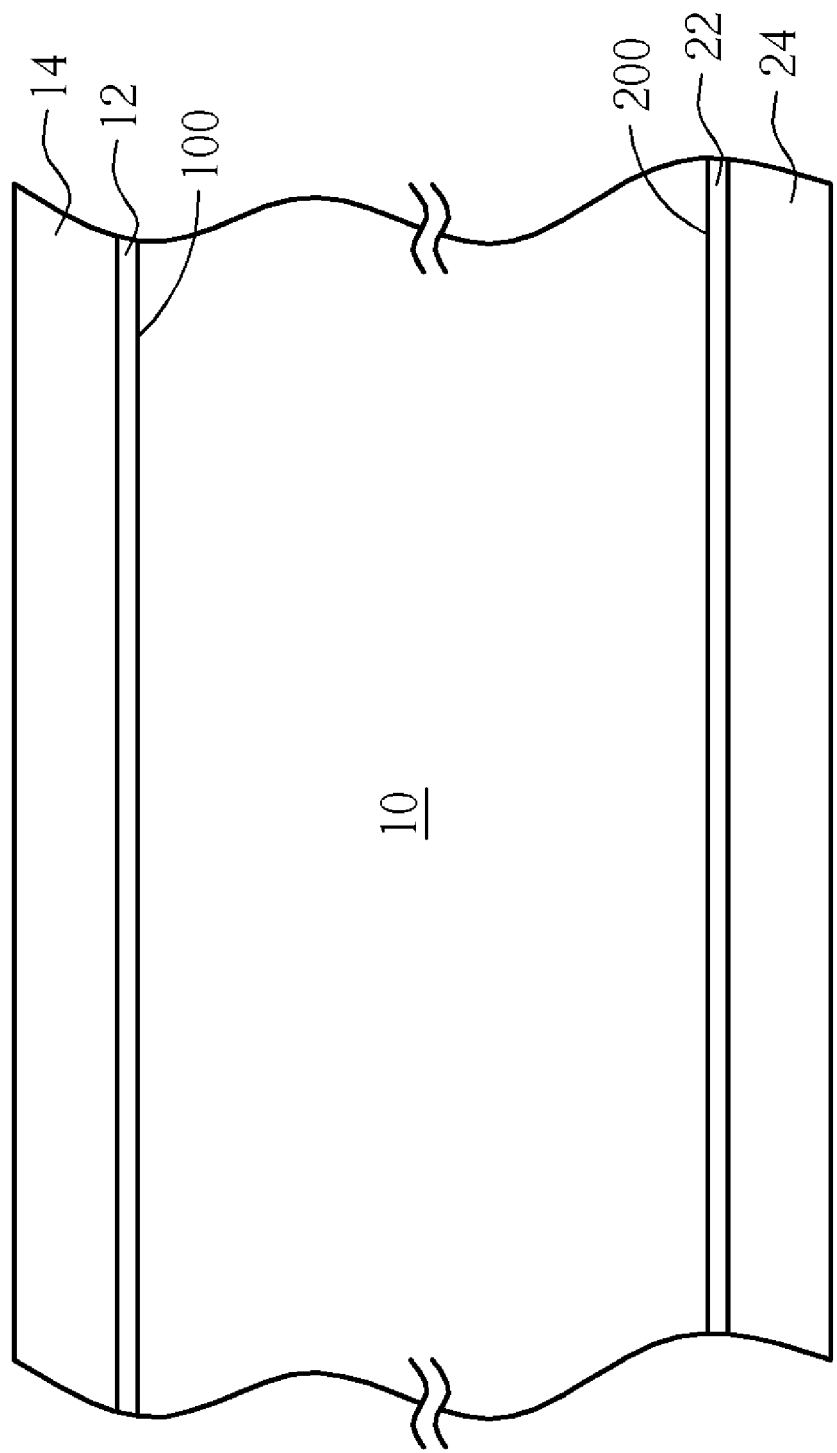
FIG. 1 to FIG. 5 are schematic, cross-sectional diagrams demonstrating a typical trench isolation process.
Figure 2:
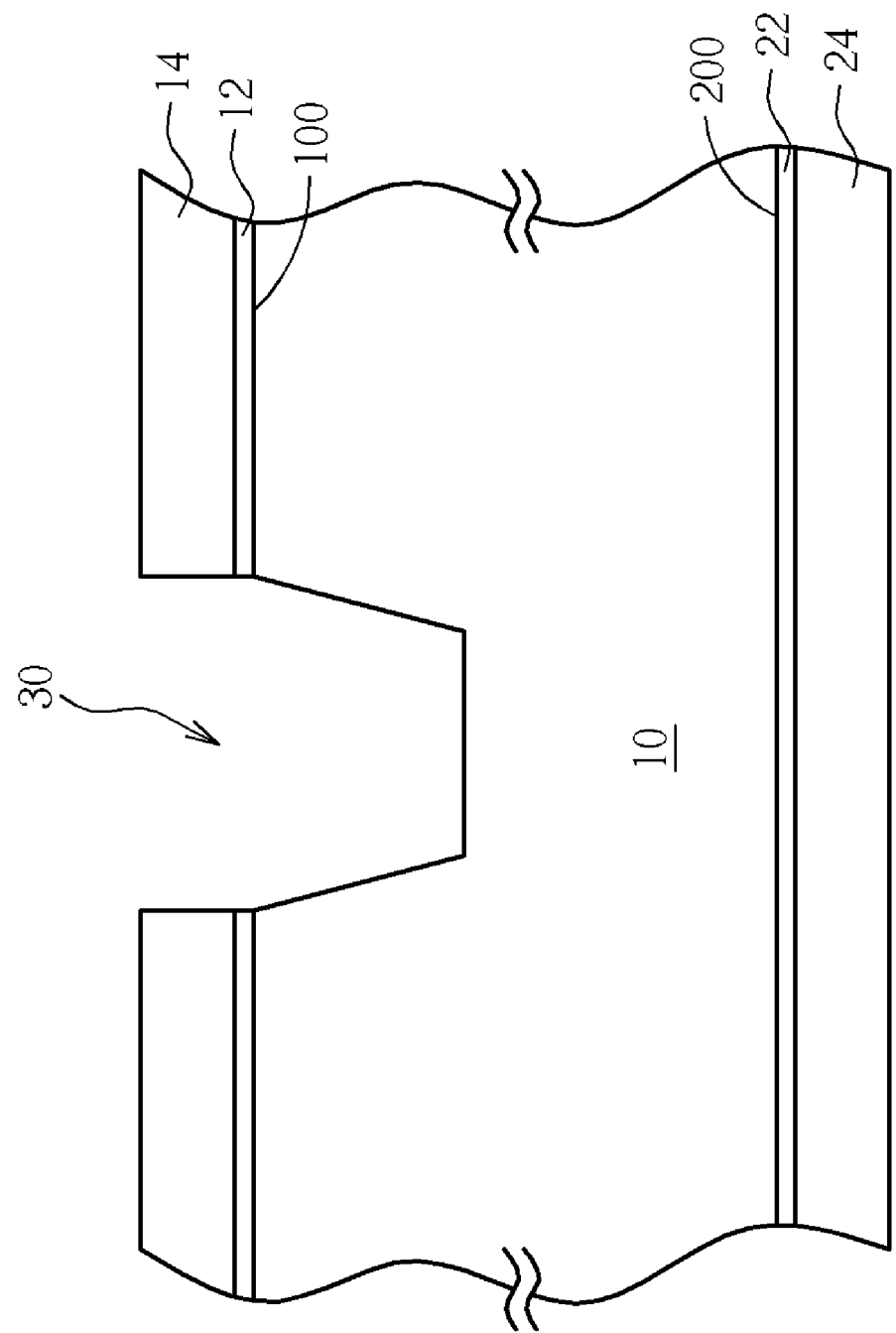
Figure 3:
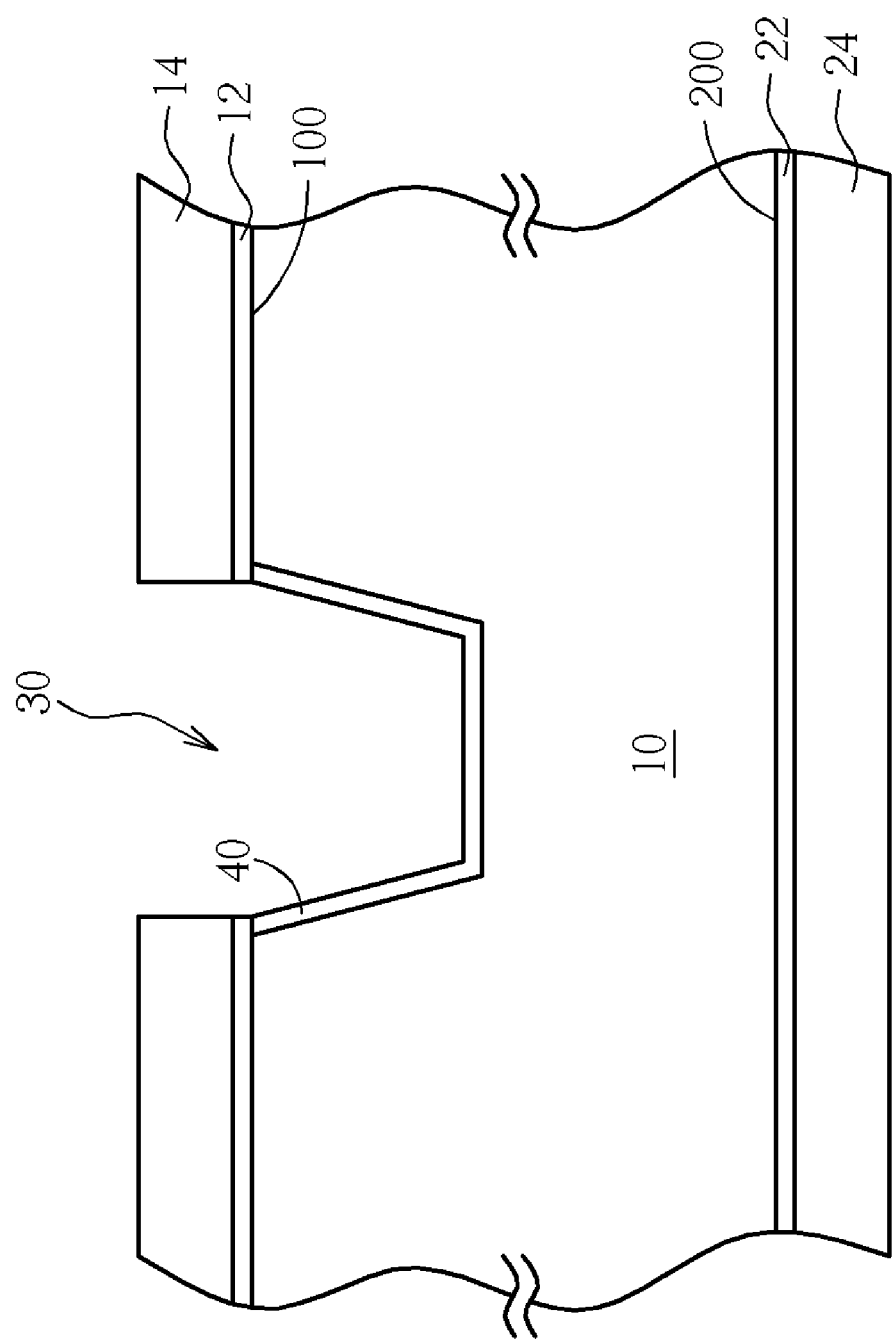
Figure 4:
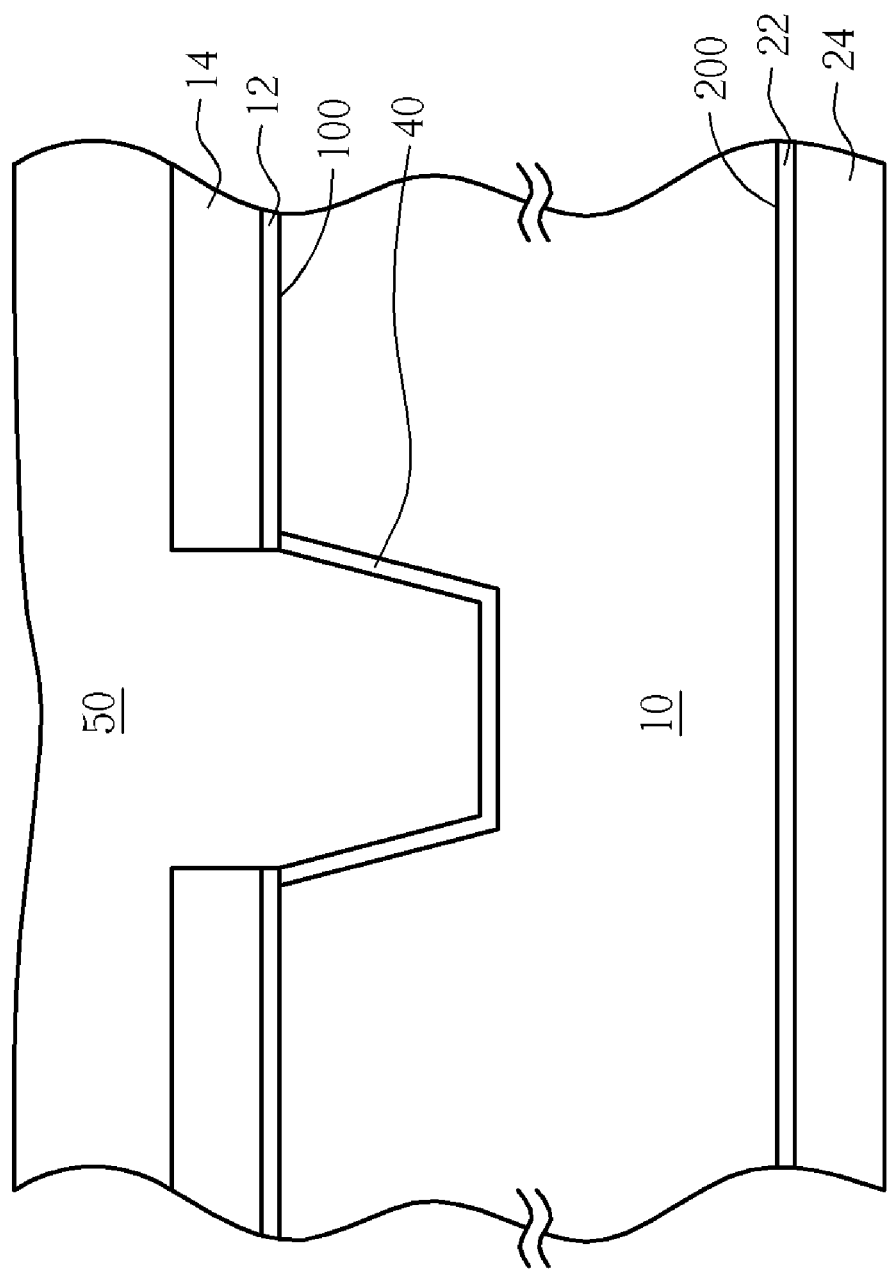
Figure 5:
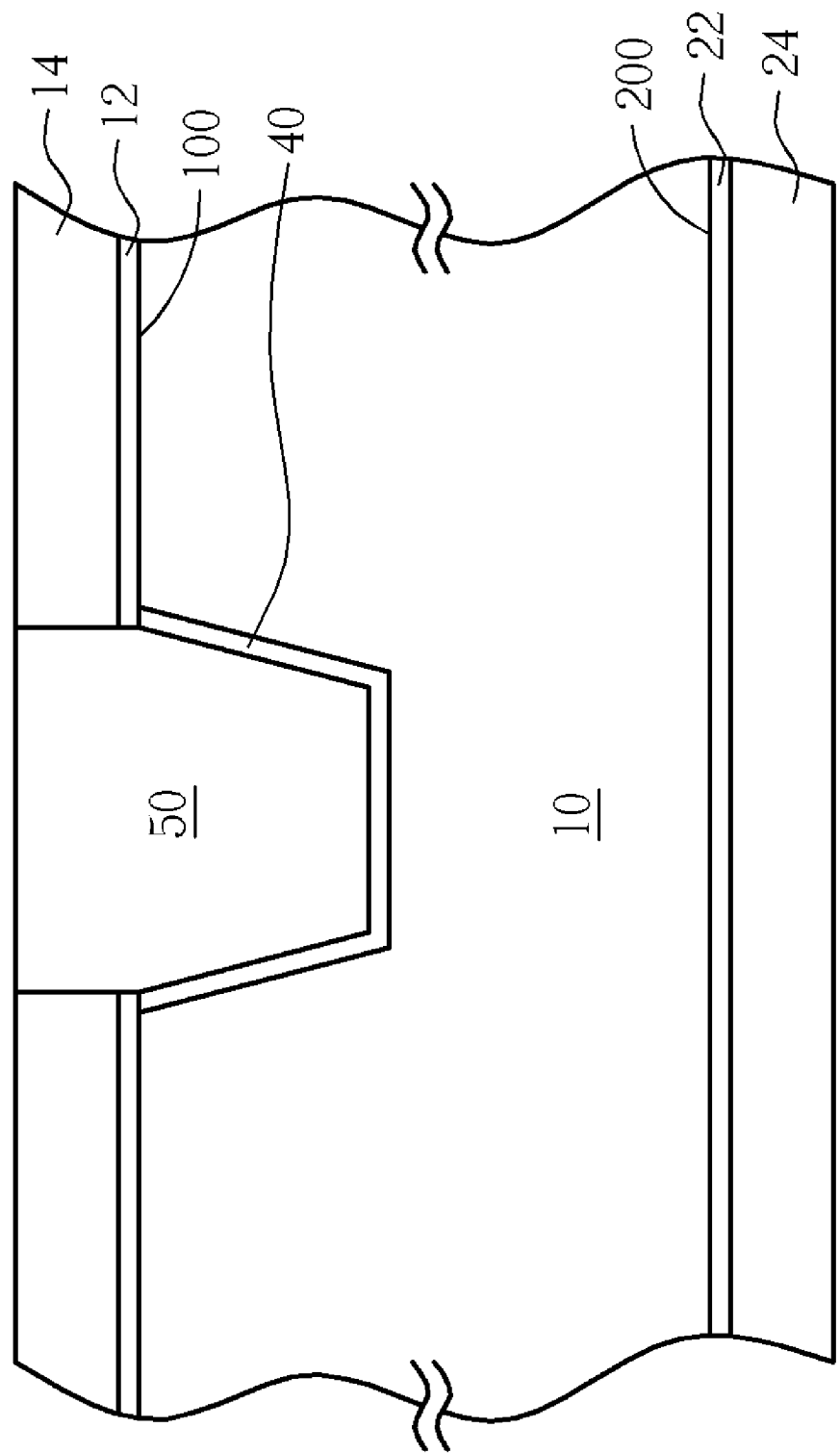
Figure 6:
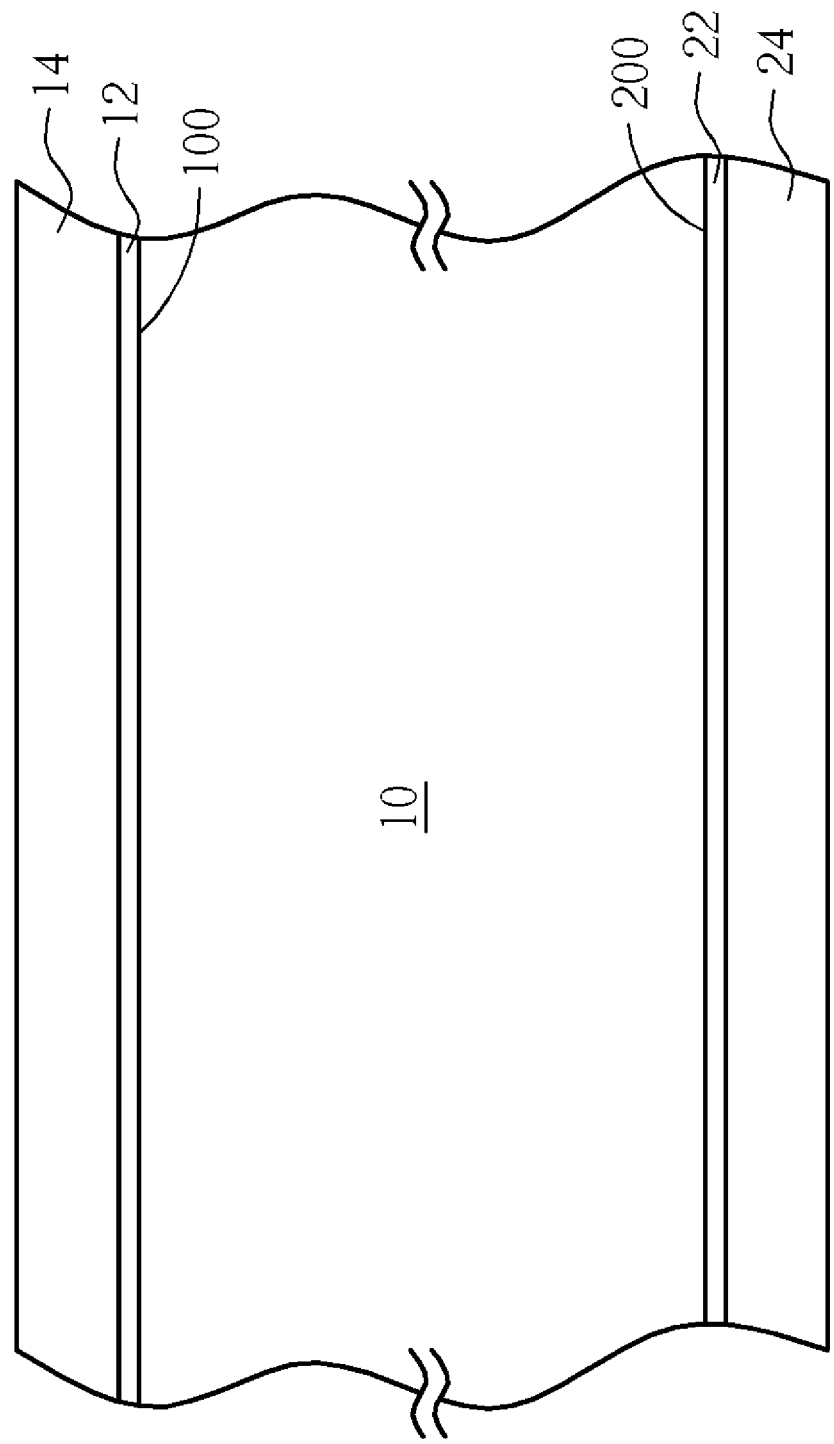
FIG. 6 to FIG. 11 are schematic, cross-sectional diagrams demonstrating the improved trench isolation process in accordance with this invention.

FIG. 6 to FIG. 11 are schematic, cross-sectional diagrams demonstrating the improved trench isolation process in accordance with this invention. As shown in FIG. 6, a pad oxide layer 12 and a pad nitride layer 14 are sequentially formed on a front surface 100 of a semiconductor substrate 10. The pad oxide layer 12 is a thermally grown film, and has a thickness of about 80~150 angstroms. The pad nitride layer 14 is formed by furnace chemical vapor deposition methods and has a thickness of about 1000~2000 angstroms. Simultaneously, a silicon oxide layer 22 and a silicon nitride layer 24 are formed on the backside 200 of the semiconductor substrate 10.

Figure 7:
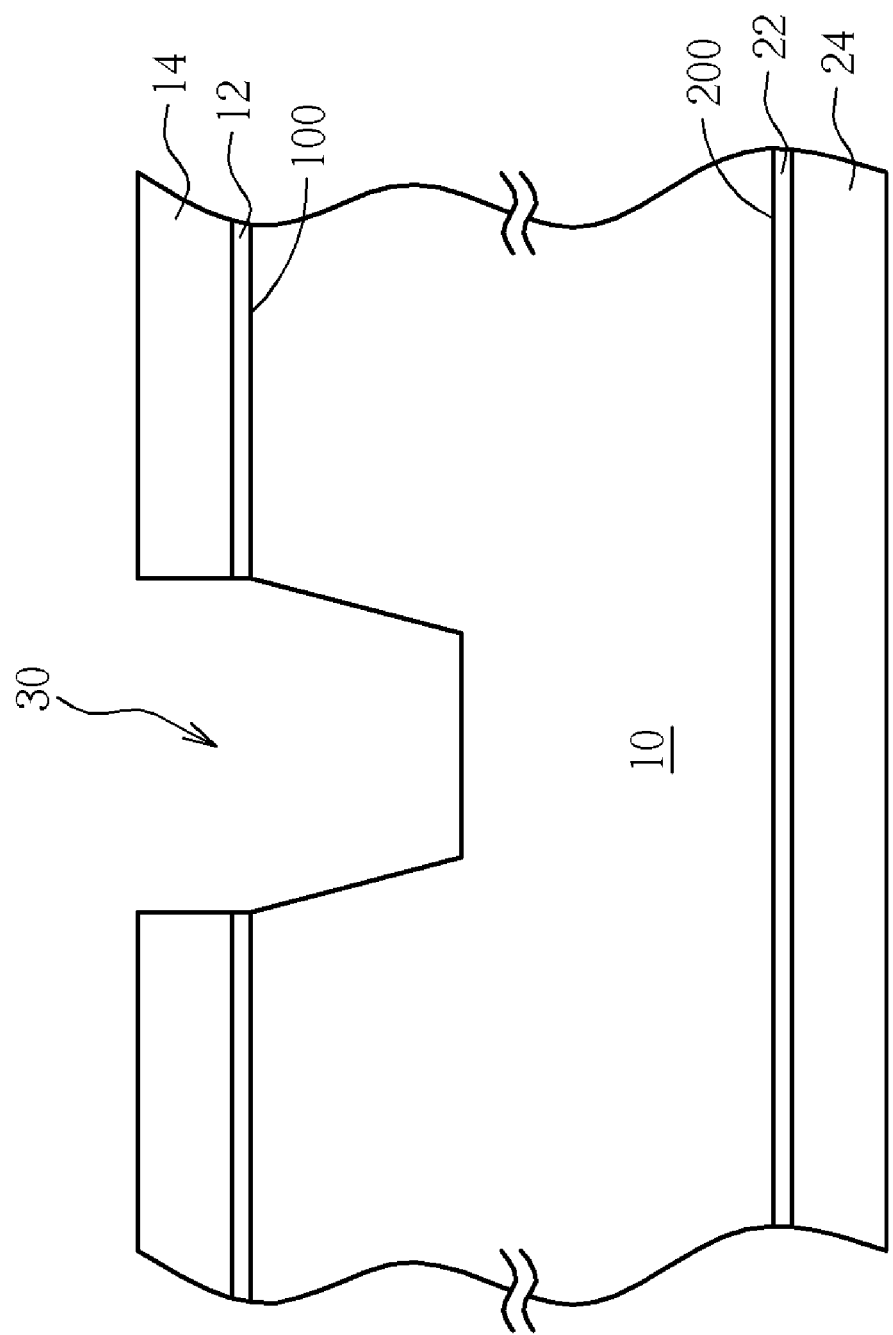

As shown in FIG. 7, likewise, using the pad nitride layer 14 as an etching hard mask, a lithographic process and an etching process are carried out to etch a trench 30 into the selected area of the front surface 100 of the semiconductor substrate 10.

Figure 8:
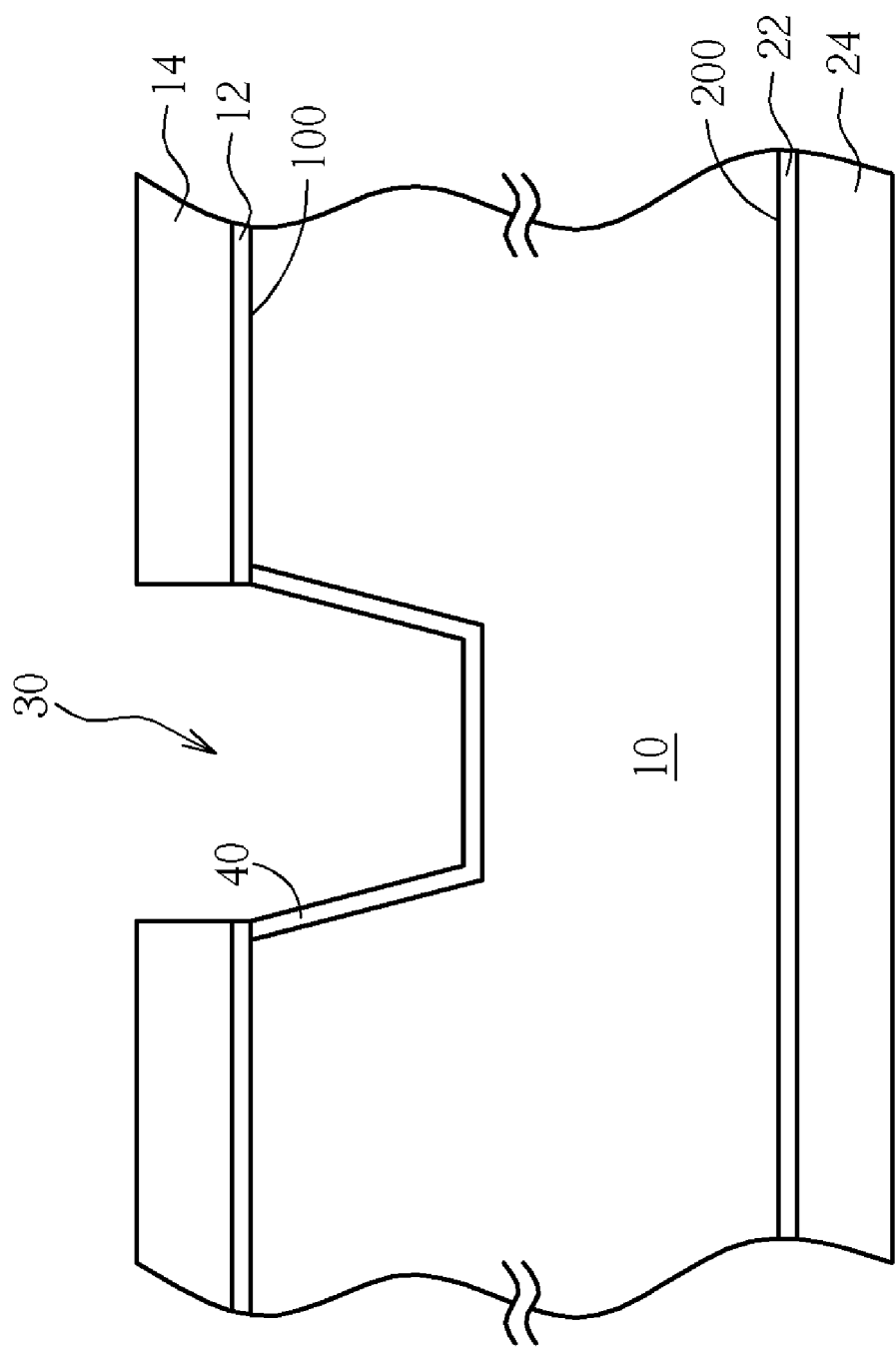

As shown in FIG. 8, optionally, an oxidation process is carried out to form a liner oxide layer 40 on interior surface of the trench 30.

Figure 9:
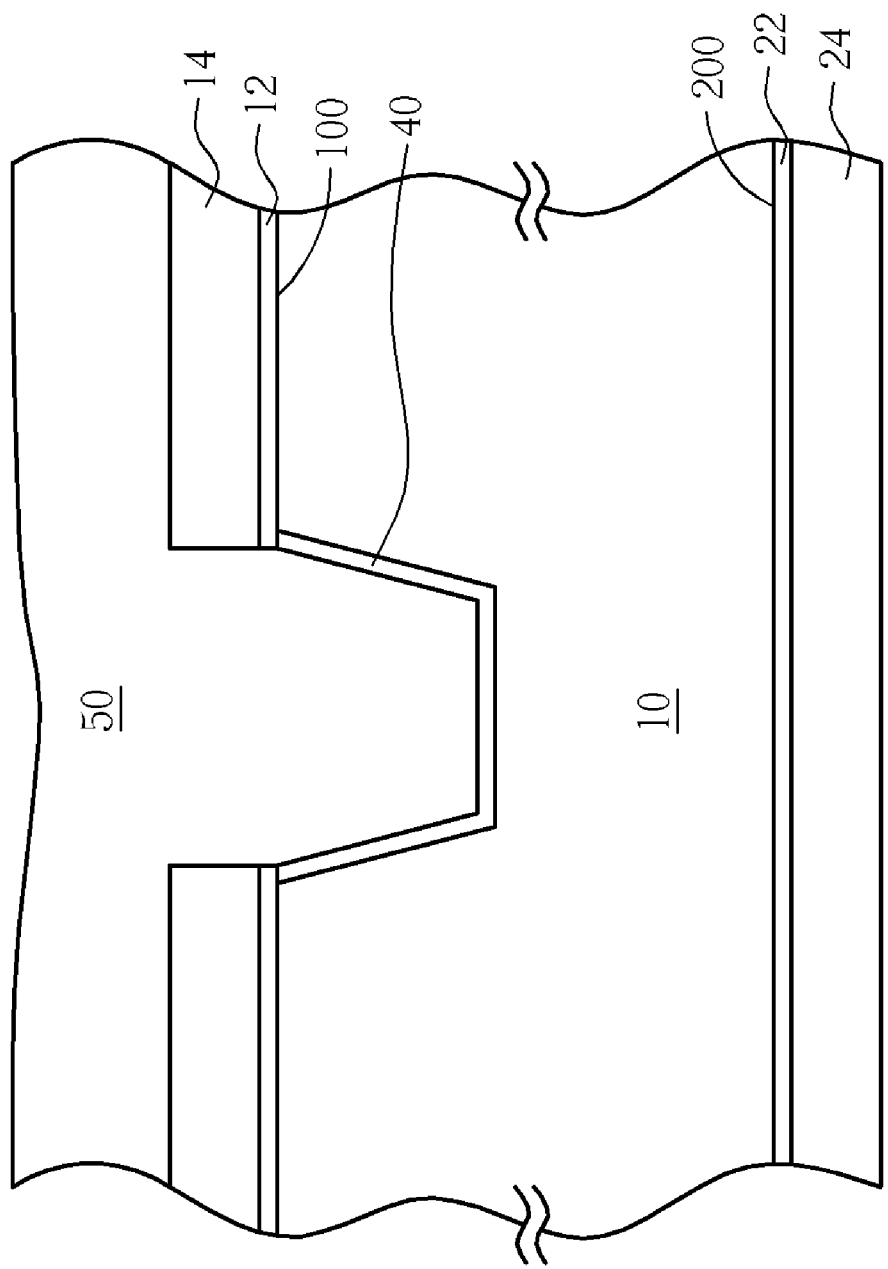

As shown in FIG. 9, a high-density plasma chemical vapor deposition (HDP CVD) process is performed to deposit a high-density plasma silicon oxide film 50 over the substrate and into the trench 30.

Figure 10:
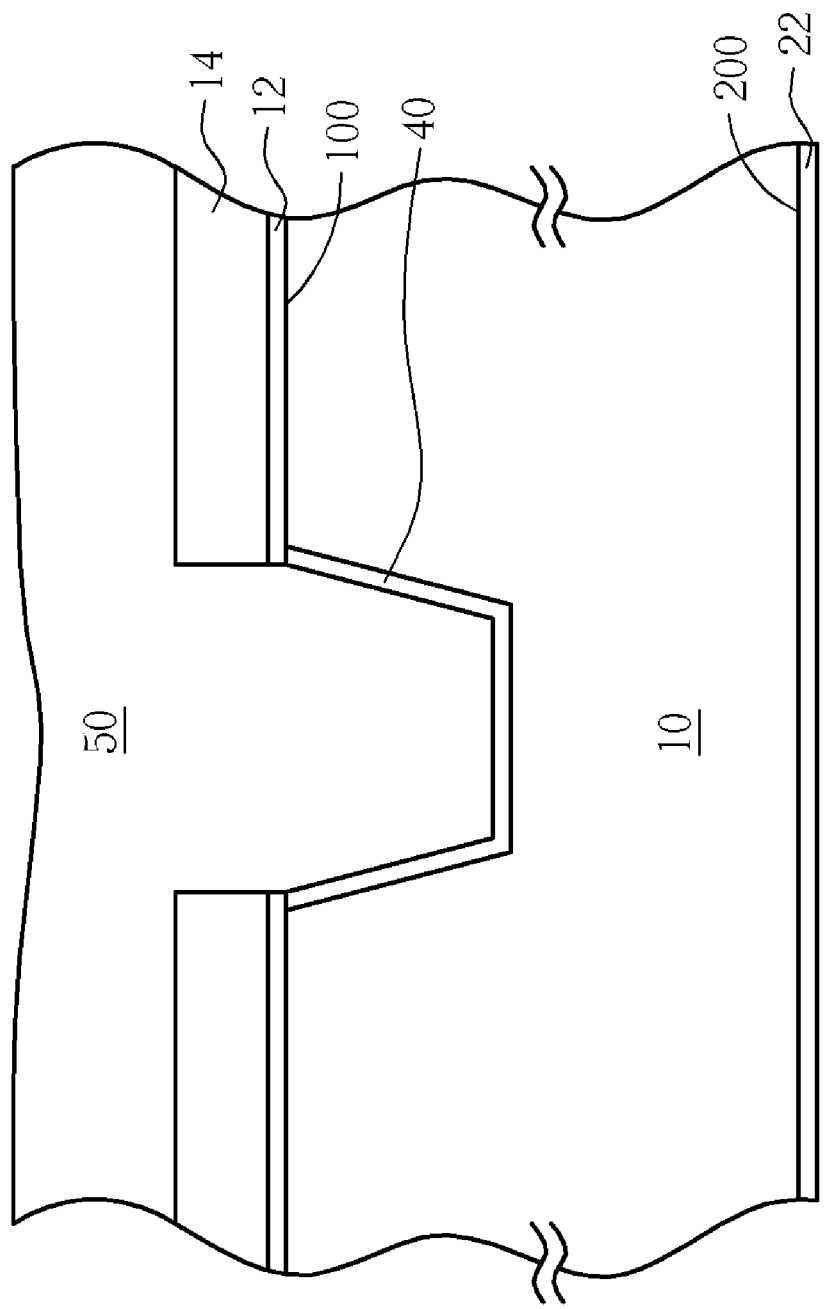

As shown in FIG. 10, prior to the densification process, the silicon nitride layer 24 is removed from the backside 200 of the semiconductor substrate 10. The removal of the silicon nitride layer 24 may be completed by using wet etching methods such as dipping in heated phosphoric acid solution. In another preferred embodiment, the silicon oxide layer 22 may be removed after the removal of the silicon nitride layer 24. The removal of the silicon oxide layer 22 may be completed using diluted hydrofluoric acid. At this phase, the patterned pad nitride layer 14 is not affected since it is covered with the high-density plasma silicon oxide film 50.

To provide better isolation, the high-density plasma silicon oxide film 50 is then subjected to the densification process under an inert environment, for example, in $N_2$ environment at a temperature greater than 1000° C. for a time period of about 30 minutes or more. As previously alluded, another purpose of this densification process is to repair the damaged silicon surface due to the etching plasma. A higher temperature can be used during the densification process without inducing dislocation or slipping defects because the silicon nitride layer 24 at the backside has been removed.

Figure 11:
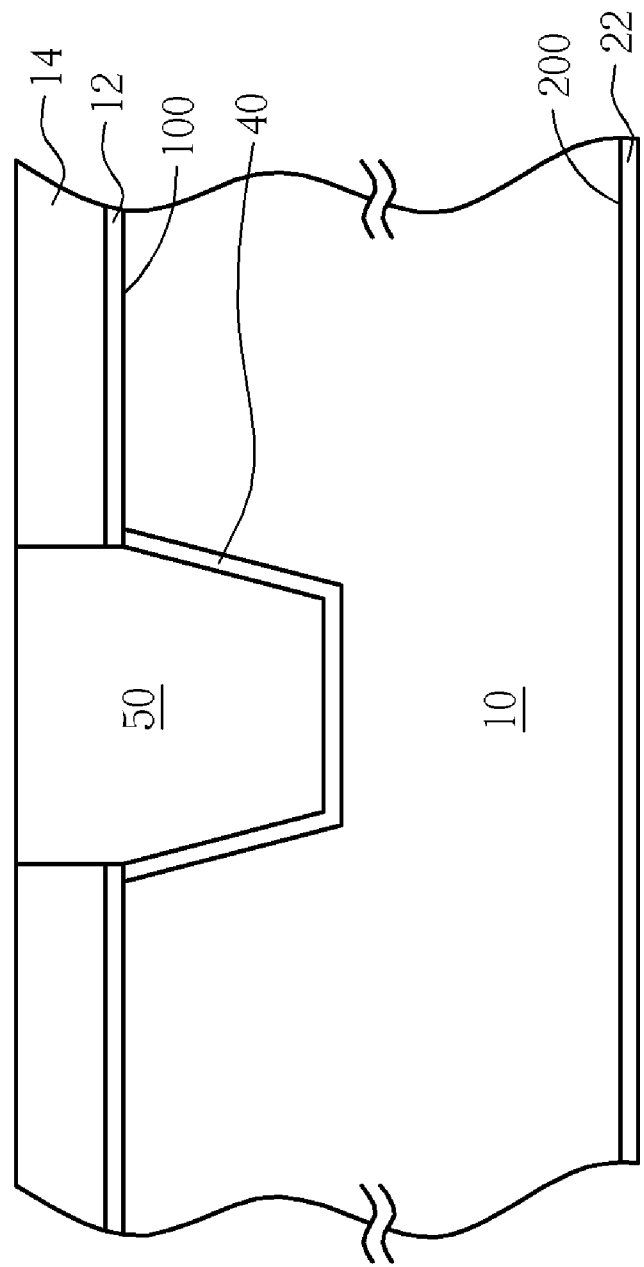

Finally, as shown in FIG. 11, using the pad nitride layer 14 as a polish stop, a chemical mechanical polishing (CMP) process is then conducted to planarize the high-density plasma silicon oxide film 50.

The advantages of this invention include:

(1) Peeling of the backside silicon nitride and potential particle source are eliminated since the removal of the backside silicon nitride layer 24.

(2) A higher temperature can be used during the densification process without inducing dislocation or slipping defects because the silicon nitride layer 24 at the backside has been removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating trench isolation, comprising:
   providing a semiconductor substrate having a front surface and a backside;
   forming a first silicon oxide layer on the front surface of the semiconductor substrate and, simultaneously, forming a second silicon oxide layer on the backside of the semiconductor substrate;
   forming a first silicon nitride layer on the front surface of the semiconductor substrate and, simultaneously, forming a second silicon nitride layer on the backside of the semiconductor substrate;
   performing lithographic and etching process and using the first silicon nitride layer as an etching hard mask to etch a trench into the front surface of the semiconductor substrate;
   filling the trench with insulating material, the insulating material also covering the first silicon nitride layer;
   using the insulating material as an etching hard mask and etching away the second silicon nitride layer on the backside of the semiconductor substrate;
   performing a densification process to densify the insulating material; and
   performing a chemical mechanical polishing process and using the first silicon nitride layer as a polish stop to planarize the insulating material.

2. The method according to claim 1 wherein before filling the trench with insulating material, the method further comprises the following step:
   forming a liner oxide layer on interior surface of the trench.

3. The method according to claim 1 wherein the densification process is carried out in $N_2$ environment at a temperature greater than 1000° C. for a time period of about 30 minutes or more.

4. The method according to claim 1 wherein the insulating material is high-density plasma silicon oxide.

5. The method according to claim 4 wherein the high-density plasma silicon oxide is deposited by using a high-density plasma chemical vapor deposition process.

* * * * *